United States Patent
Doris et al.

(10) Patent No.: US 7,119,403 B2
(45) Date of Patent: Oct. 10, 2006

(54) HIGH PERFORMANCE STRAINED CMOS DEVICES

(75) Inventors: Bruce B. Doris, Brewster, NY (US); Oleg G. Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,672

(22) Filed: Oct. 16, 2003

(65) Prior Publication Data

US 2005/0082634 A1 Apr. 21, 2005

(51) Int. Cl.
*H01L 29/76* (2006.01)

(52) U.S. Cl. .................. 257/374; 257/E21.545

(58) Field of Classification Search .............. 257/374, 257/499, E21.545; 438/424, 426
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |

(Continued)

FOREIGN PATENT DOCUMENTS

JP 57-80733 5/1982

(Continued)

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Michael Lebentritt
*Assistant Examiner*—Stanetta Isaac
(74) *Attorney, Agent, or Firm*—Joseph P Abate Esq.; Greenblum & Bernstein P.L.C.

(57) ABSTRACT

A semiconductor device and method of manufacture provide an n-channel field effect transistor (nFET) having a shallow trench isolation with overhangs that overhang Si—$SiO_2$ interfaces in a direction parallel to the direction of current flow and in a direction transverse to current flow. The device and method also provide a p-channel field effect transistor (pFET) having a shallow trench isolation with an overhang that overhangs Si—$SiO_2$ interfaces in a direction transverse to current flow. However, the shallow trench isolation for the pFET is devoid of overhangs, in the direction parallel to the direction of current flow.

16 Claims, 11 Drawing Sheets

U.S. PATENT DOCUMENTS

| | | | |
|---|---|---|---|
| 5,683,934 A | 11/1997 | Candelaria | |
| 5,834,358 A * | 11/1998 | Pan et al. | 438/424 |
| 5,840,593 A | 11/1998 | Leedy | |
| 5,861,651 A | 1/1999 | Brasen et al. | |
| 5,880,040 A | 3/1999 | Sun et al. | |
| 5,940,716 A * | 8/1999 | Jin et al. | 438/424 |
| 5,940,736 A | 8/1999 | Brady et al. | |
| 5,946,559 A | 8/1999 | Leedy | |
| 5,953,621 A * | 9/1999 | Gonzalez et al. | 438/424 |
| 5,960,297 A * | 9/1999 | Saki | 438/424 |
| 5,963,819 A * | 10/1999 | Lan | 438/424 |
| 5,976,948 A * | 11/1999 | Werner et al. | 438/424 |
| 5,981,356 A * | 11/1999 | Hsueh et al. | 438/424 |
| 5,989,978 A | 11/1999 | Peidous | |
| 6,001,707 A * | 12/1999 | Lin et al. | 438/433 |
| 6,008,126 A | 12/1999 | Leedy | |
| 6,020,622 A * | 2/2000 | Tsuda et al. | 257/513 |
| 6,022,781 A * | 2/2000 | Noble et al. | 438/296 |
| 6,025,280 A | 2/2000 | Brady et al. | |
| 6,046,464 A | 4/2000 | Schetzina | |
| 6,066,545 A | 5/2000 | Doshi et al. | |
| 6,080,637 A * | 6/2000 | Huang et al. | 438/424 |
| 6,090,684 A | 7/2000 | Ishitsuka et al. | |
| 6,093,621 A * | 7/2000 | Tseng | 438/424 |
| 6,097,076 A * | 8/2000 | Gonzalez et al. | 257/513 |
| 6,107,143 A | 8/2000 | Park et al. | |
| 6,117,722 A | 9/2000 | Wuu et al. | |
| 6,133,071 A | 10/2000 | Nagai | |
| 6,143,623 A * | 11/2000 | Tsuda et al. | 438/425 |
| 6,153,478 A * | 11/2000 | Lin et al. | 438/296 |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,271,143 B1 * | 8/2001 | Mendicino | 438/700 |
| 6,271,147 B1 * | 8/2001 | Tseng | 438/725 |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,316,815 B1 * | 11/2001 | Tseng | 257/510 |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,368,973 B1 * | 4/2002 | Tseng | 438/692 |
| 6,403,486 B1 | 6/2002 | Lou | |
| 6,403,975 B1 | 6/2002 | Brunner et al. | |
| 6,406,973 B1 | 6/2002 | Lee | |
| 6,417,072 B1 * | 7/2002 | Coronel et al. | 438/424 |
| 6,461,936 B1 | 10/2002 | von Ehrenwall | |
| 6,476,462 B1 | 11/2002 | Shimizu et al. | |
| 6,493,497 B1 | 12/2002 | Ramdani et al. | |
| 6,498,358 B1 | 12/2002 | Lach et al. | |
| 6,501,048 B1 * | 12/2002 | Strom | 219/121.85 |
| 6,501,121 B1 | 12/2002 | Yu et al. | |
| 6,506,652 B1 | 1/2003 | Jan et al. | |
| 6,509,618 B1 | 1/2003 | Jan et al. | |
| 6,521,964 B1 | 2/2003 | Jan et al. | |
| 6,531,369 B1 | 3/2003 | Ozkan et al. | |
| 6,531,740 B1 | 3/2003 | Bosco et al. | |
| 6,566,225 B1 * | 5/2003 | Lai et al. | 438/424 |
| 6,583,060 B1 * | 6/2003 | Trivedi | 438/700 |
| 6,831,292 B1 | 12/2004 | Currie et al. | |
| 2001/0009784 A1 | 7/2001 | Ma et al. | |
| 2001/0014511 A1 * | 8/2001 | Pan | 438/424 |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2003/0181014 A1 * | 9/2003 | Ohta et al. | 438/294 |

FOREIGN PATENT DOCUMENTS

| | | |
|---|---|---|
| JP | 2000-269466 | 9/2000 |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp. 98-99.

Gregory Scott, et al., "NMOS Drive Current Reduction Caused by Transistor Layout and Trench Isolation Induced Stress", International Electron Devics Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

HIGH PERFORMANCE STRAINED CMOS DEVICES

BACKGROUND OF INVENTION

The invention generally relates to a semiconductor device and method of manufacture and, more particularly, to a complementary metal-oxide-semiconductor (CMOS) device that includes shallow trench isolations (STI) over-hanging interfaces thus preventing oxidation induced compressive stresses in the device.

CMOS devices may be fabricated using various process techniques. One method entails fabricating strained Silicon (Si) layers on relaxed Silicon Germanium (SiGe) layers. As the Germanium (Ge) concentration increases, strain in the Si lattice increases. This is significant because such strain affects performance (e.g., electron and hole mobility). While strain may improve electron mobility in n-channel field effect transistors (nFETs), performance improvement (i.e., enhancement of hole mobility) in p-channel field effect transistors (p-FETs) poses a greater challenge. Hole mobility in a pFET initially exhibits a slight degradation at low amount of tensile strain, but increases linearly with higher strain.

Compressive stress applied in the longitudinal direction with respect to the current flow may cause a significant increase in hole mobility, but may also degrade electron mobility. The shallow trench isolation (STI) process commonly used in CMOS fabrications to isolate discrete components to prevent interference is susceptible to volume expansion induced stress caused by oxidation. This stress can substantially affect performance, such as adversely by decreasing nFET electron mobility.

In particular, Si located adjacent to the vertical portion of an STI is susceptible to oxidation induced stress. The Si may become oxidized during gate oxidation or reoxidation of a gate stack. The oxidized portion may exhibit significantly increased thickness due to the use of multiple gate oxidations, which is common in fabricating high performance logic circuits. The increased thickness induces stress in the silicon active area, which can affect performance, such as adversely by decreasing nFET electron mobility.

The effect on performance of such oxidation induced compressive stresses is magnified when the source of the stress is close to a transistor gate. Modern CMOS chips have millions of active devices side by side in a common silicon substrate. As efforts to miniaturize and incorporate more active devices on a single substrate continue, it becomes increasingly likely that such sources of stress will be close enough to appreciably impact performance.

The invention is directed to overcoming one or more of the problems as set forth above.

SUMMARY OF INVENTION

In a first aspect of the invention a semiconductor structure is formed on a substrate, comprising at least one shallow trench isolation having at least one overhang selectively configured to prevent oxidation induced stress in a determined portion of the substrate.

In another aspect of the invention, a semiconductor structure is formed on a substrate. The structure includes a first field effect transistor having a source, a drain, a gate, and a direction of current flow from the source to the drain. The structure also includes a first shallow trench isolation for the first field effect transistor. The first shallow trench isolation has at least one overhang configured to prevent oxidation induced stress in a direction parallel to the direction of current flow for the first field effect transistor.

In a further aspect of the invention, a process of forming a semiconductor structure is provided. The process entails forming a first shallow trench isolation. The shallow trench isolation has at least one overhang configured to prevent oxidation induced stress in a first determined direction. In the process, a structure is formed comprising a silicon layer, a silicon dioxide layer on the silicon layer, and a silicon nitride layer on the silicon dioxide layer. A portion of the silicon nitride layer, the silicon dioxide layer and the silicon substrate is etched to form a trench. Side-wall portions of the silicon nitride layer in the trench are etched to create a recession of the silicon nitride layer relative to the trench. A shallow trench isolation is formed in the trench, which in embodiments has an overhang.

DETAILED DESCRIPTION

The invention employs a silicon nitride ($Si_3N_4$) pull-back process in combination with a mask used to prevent the $Si_3N_4$ pull-back from being executed in the longitudinal components of some or all pFET devices. The resulting semiconductor structure has overhang structures (referred to herein as overhang, $SiO_2$ overhang, and STI overhang) present for nFET devices in the directions of and transverse to current flow. To enhance performance due to compressive stresses, no silicon dioxide ($SiO_2$) overhang is present in the direction parallel to the direction of current flow for pFET devices.

However, the structure has SiO$_2$ overhangs in the direction transverse to current flow for pFET devices to avoid performance degradation from compressive stresses. The overhang structures prevent oxidation by blocking access to underlying Si. Without an overhang, Si at the vertical Si—SiO$_2$ interface adjacent to the shallow trench isolation would be susceptible to oxidation and attendant volume expansion, especially during gate oxidation and reoxidation process steps. It is believed that the resulting semi-conductor structure enables pFET performance improvement with little or no nFET performance degradation. Additionally, the overhang structure is detectable using standard failure analysis techniques such as scanning electron microscopy (SEM).

Figure 1:
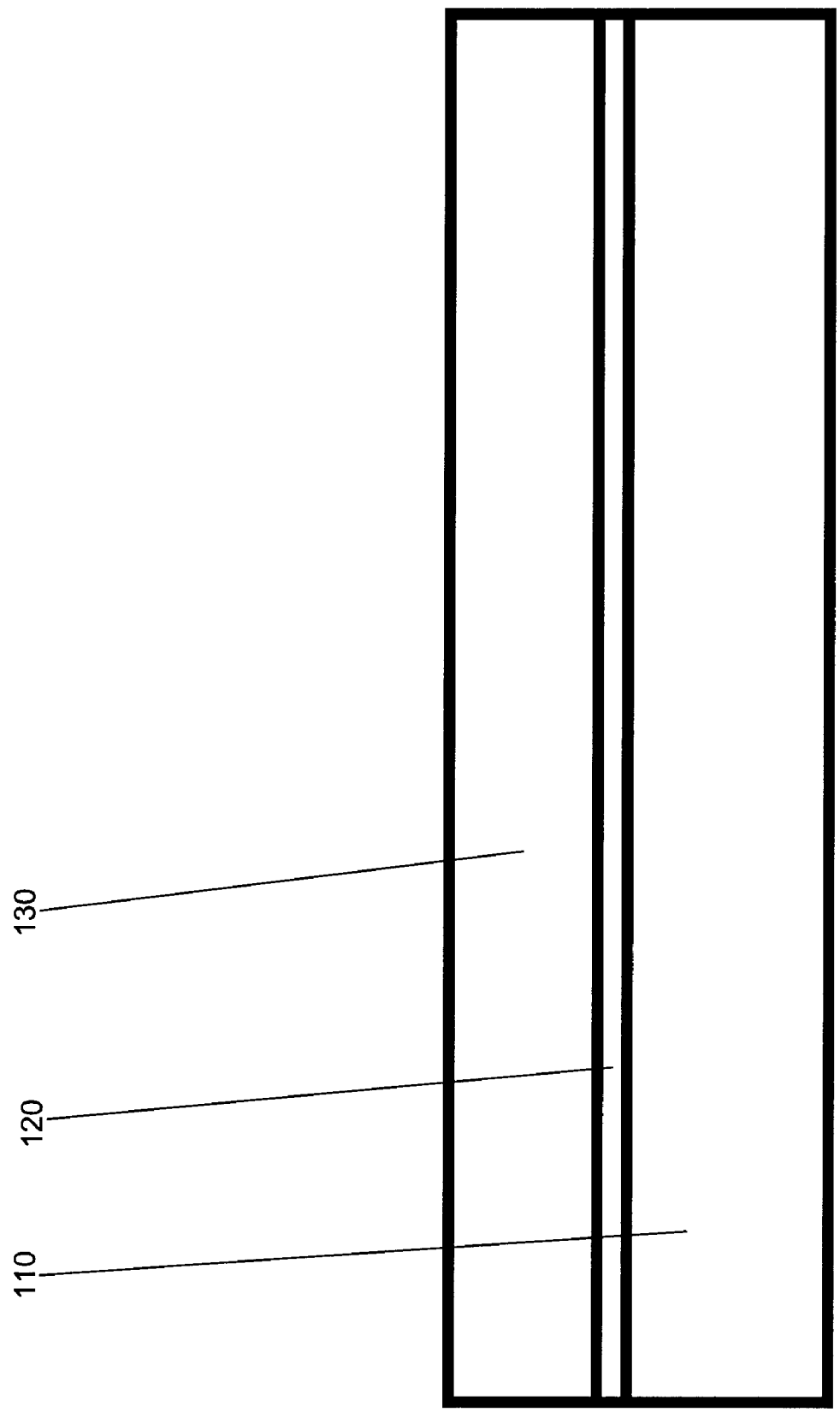
FIG. 1 shows a silicon substrate with oxide and nitride layers for use in accordance with an exemplary implementation of the invention.

Referring to FIG. 1, a silicon substrate 110, a pad silicon dioxide (SiO$_2$) layer 120 and a pad silicon nitride (Si$_3$N$_4$) layer 130 are provided. By way of example, the silicon substrate may be a silicon wafer, an epitaxial layer formed on a silicon wafer or a silicon-on-insulator (SOI) substrate. The silicon dioxide layer 120 may be about 2 nm to 70 nm thick, and may be deposited or grown on the wafer. For example, the silicon dioxide layer 120 may be formed by thermal oxidation or by low pressure chemical vapor deposition (LPCVD). Next, the silicon nitride layer 130, in the range of about 10 to 400 nm, may be deposited by LPCVD.

Figure 2:
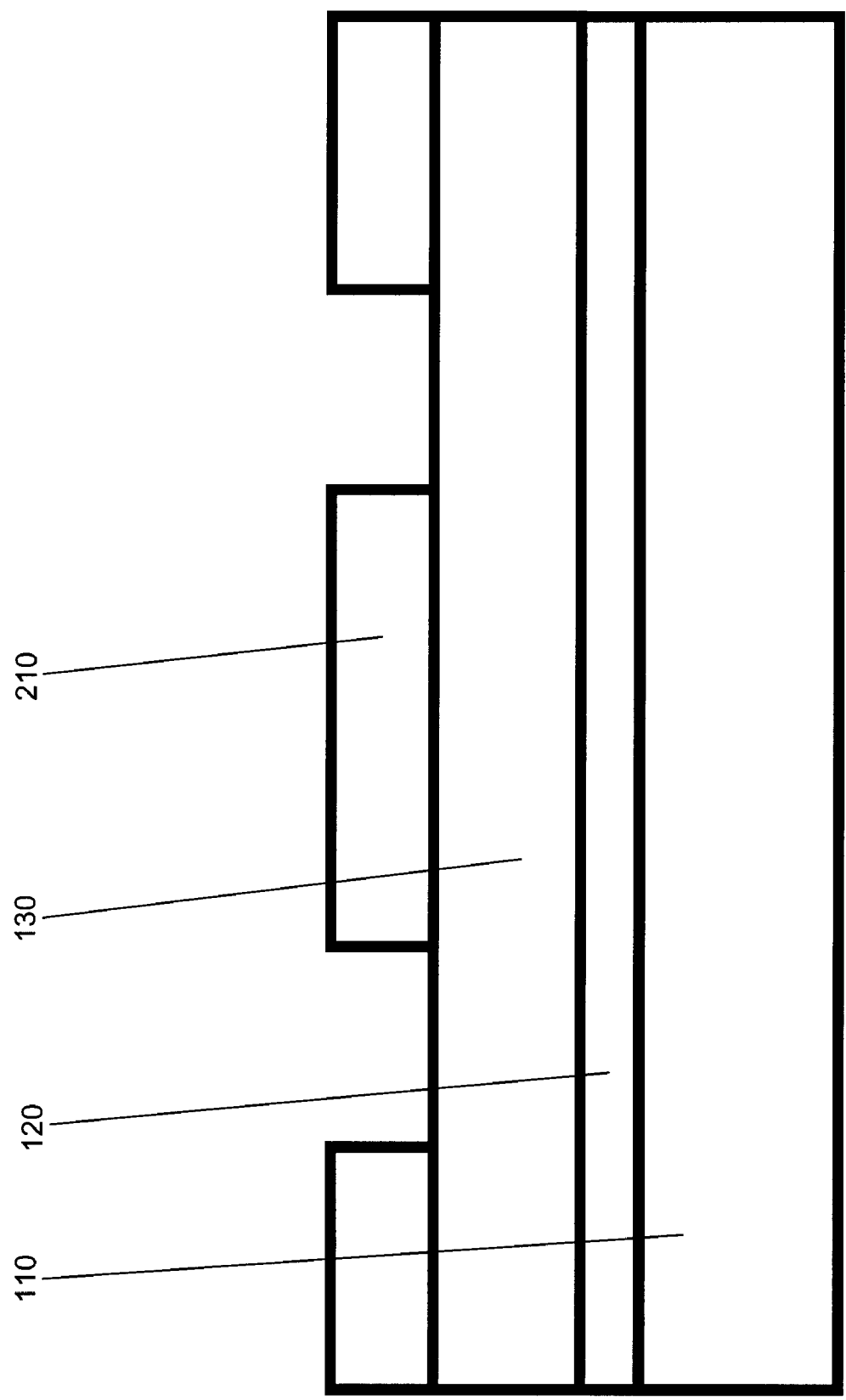
FIG. 2 shows a silicon substrate with patterned photoresist images on a nitride surface for use in accordance with an exemplary implementation of the invention.

Referring now to FIG. 2, a photolithography process may then be carried out to pattern photoresist images 210 over the silicon nitride layer 130. The inverse pattern may then be etched using a dry or wet etch process (e.g., by reactive ion etching using the patterned photoresist as a mask) to form trench structures, as is well known in the art.

Figure 3:
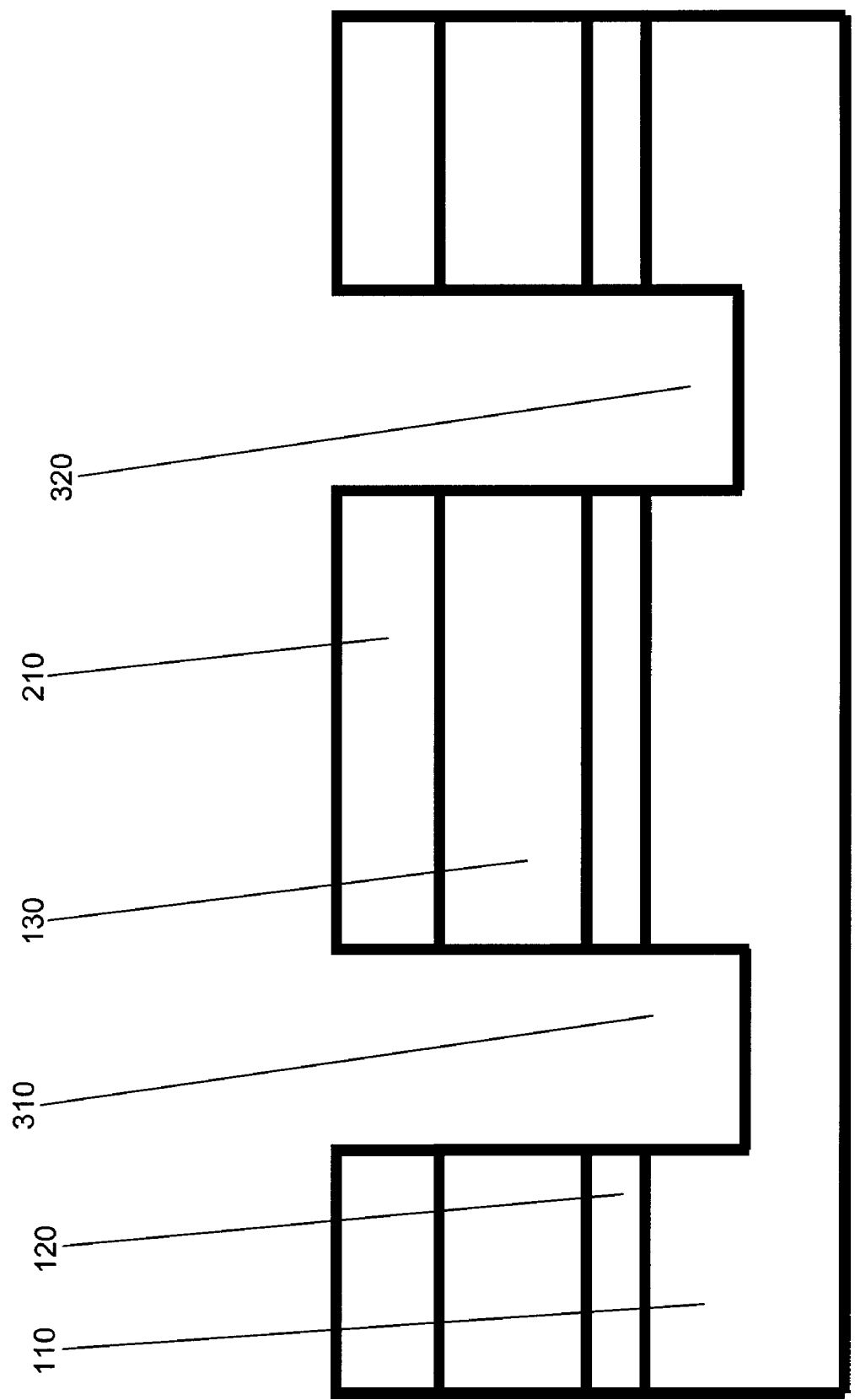
FIG. 3 shows an etched semiconductor structure with trenches for use in accordance with an exemplary implementation of the invention.

Referring now to FIG. 3, the dry or wet etch process may be carried out to etch the silicon nitride 130, silicon dioxide 120 and some amount of the silicon substrate 110 not covered by the photoresist image 210. In this manner, trenches 310 and 320 are formed through layers 110, 120 and 130.

Figure 4:
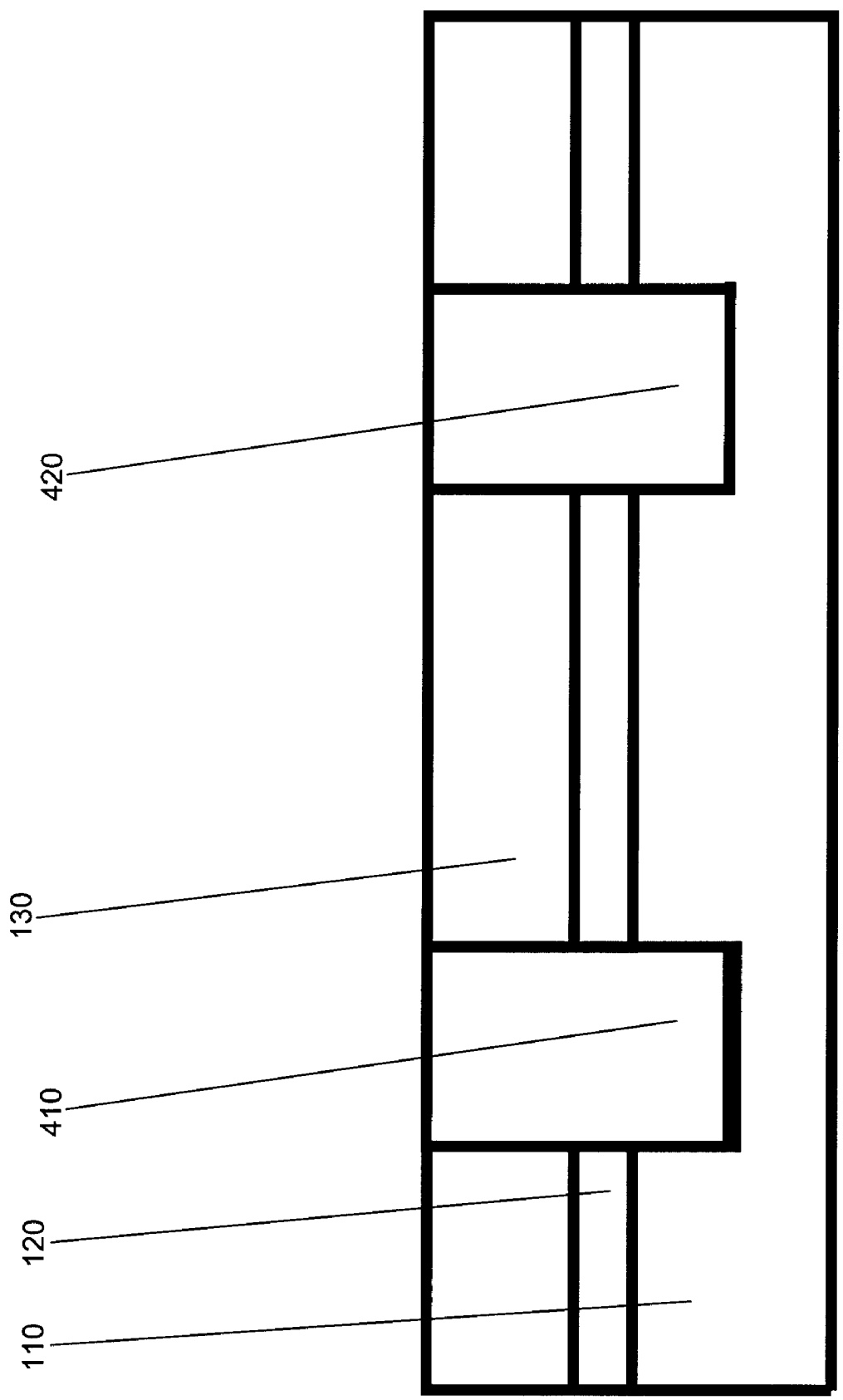
FIG. 4 shows a semiconductor structure having shallow trench isolations for use in accordance with an exemplary implementation of the invention.

Next, referring to FIG. 4, the trenches 310 and 320 may be filled with SiO$_2$, such as by depositing SiO$_2$ over the surface of the substrate using, for example, a chemical vapor deposition (CVD) or plasma CVD process. The deposited SiO$_2$ may then be planarized using, for example, reactive ion etching (RIE), chemical mechanical polishing, or a combination thereof. In this manner, shallow trench isolations 410 and 420 are formed. These shallow trench isolations 410 and 420 do not exhibit overhang.

Figure 5:
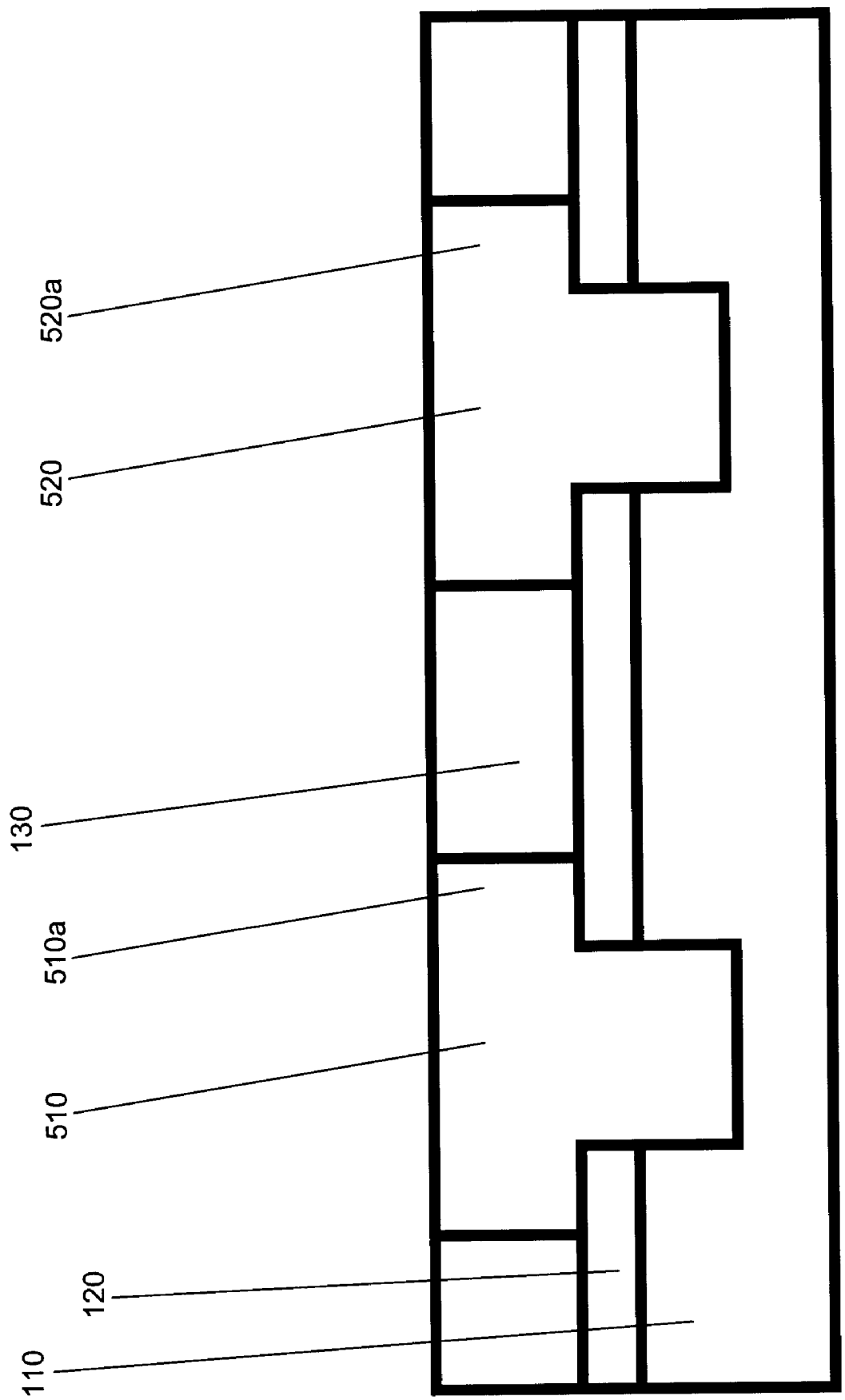
FIG. 5 shows a semiconductor structure having shallow trench isolations with overhangs for use in accordance with an exemplary implementation of the invention.

To form a shallow trench isolation with an overhang, before deposition of SiO$_2$ to fill the trench, portions of the silicon nitride layer 130 are etched, causing them to recede or pull-back relative to the side walls of the trench, as shown in FIG. 5 The silicon nitride layer 130 may be etched (i.e., "pulled back"), for example, by introducing an etchant such as a glycerated buffered hydrofluoric acid in trenches 310 and 320 prior to oxide deposition and chemical mechanical polishing. The amount of silicon nitride to be etched in this step will depend upon the overall manufacturing process into which the teachings of this invention are incorporated. In general, the amount should be sufficient to enable formation of an overhang that is sufficient to prevent oxidation in a determined portion of the device. However, the overhang should not interfere with other structures on the device. By way of example and not limitation, an overhang that extends beyond the STI-substrate interface by 0.01 µm to 0.5 µm (microns) should be sufficient to prevent oxidation without causing interference.

To control where overhangs are formed, a photoresist or hardmask may be selectively applied to prevent etchant (e.g., glycerated buffered hydrofluoric acid) from undercutting determined areas. Areas protected by a photoresist or hardmask would not exhibit pull-back required for the formation of overhangs. Processes for depositing and patterning a hardmask or photoresist are known in the art of semiconductor fabrication. The hardmask or photoresist may then be removed in subsequent processing steps.

Then, upon deposition of the SiO$_2$ and planarization, for example, RIE or chemical mechanical polishing, the structures 510 and 520 are formed, as shown in FIG. 5. Portions of SiO$_2$ 122–128 (FIG. 6) from the oxide layer 120 may remain after trench formation and pull-back. As these portions 122–128 are comprised of the same material as the T-shaped structures 510 and 520, the portions are not distinguished from the T-shaped structures in subsequent Figures.

As the silicon nitride layer 130 is pulled-back from the side walls of the trench, the shallow trench isolation structures of FIG. 5 form T-shapes or a stepped portion 510a and 520a, respectively (e.g., a narrow portion embedded in the layers 110 and 120) thus forming the overhang over layer 120. Thus, the top horizontal portions or stepped portions 510a and 520a, respectively, of these shallow trench isolation structures 510 and 520 now overhang the vertical Si—SiO$_2$ interfaces 620 626 and therefore inhibit oxidation of the Si portions of the inter-faces. Consequently, oxidation induced compression may be prevented in the channel region.

Thus, pull-back enables formation of an overhang of deposited SiO$_2$, thereby protecting the covered vertical portion of Si at the Si—SiO$_2$ interfaces 620 626 from being oxidized. Oxidation-induced stresses, which might otherwise degrade performance, may be suppressed by the overhang. A CMOS circuit comprising an nFET may have STI structures with overhangs in the direction parallel to the direction of current flow and in the direction transverse to current flow to prevent oxidation of Si along the Si—SiO$_2$ interfaces. In contrast, a pFET device may have an overhang in the transverse direction, but no overhang in the direction parallel to the direction of current flow in accordance with FIG. 4.

Figure 6:
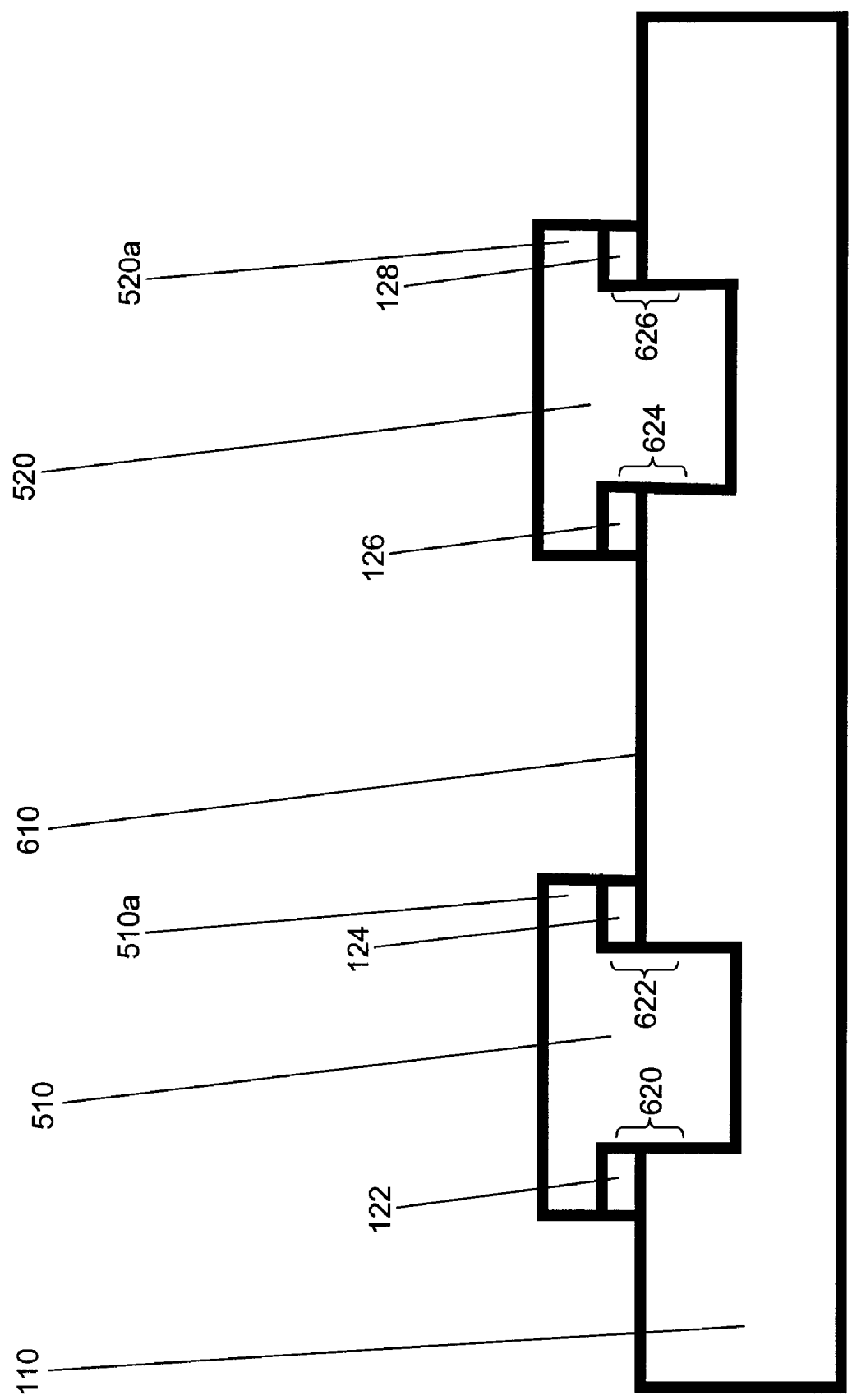
FIG. 6 shows a semiconductor structure having shallow trench isolations with overhangs after removal of a nitride layer and reduction of oxide thickness.

Next, in FIG. 6, the silicon nitride layer 130 (FIG. 5) is removed by hot phosphoric acid, for example. At this point, well implants to form source and drain regions, which are used in a conventional process flow, are carried out. A timed hydrofluoric acid etch may then be used to prepare the silicon surface for gate oxidation. The oxide layers 120, 510 and 520 are reduced in thickness by such etching.

While exemplary materials and STI overhang formation and semiconductor fabrication processes have been described, the invention is not limited in these respects. Additional and different materials and fabrication steps, including different etchants and pull-back and overhang formation techniques, may be applied without departing from the scope of the invention.

Figure 7:
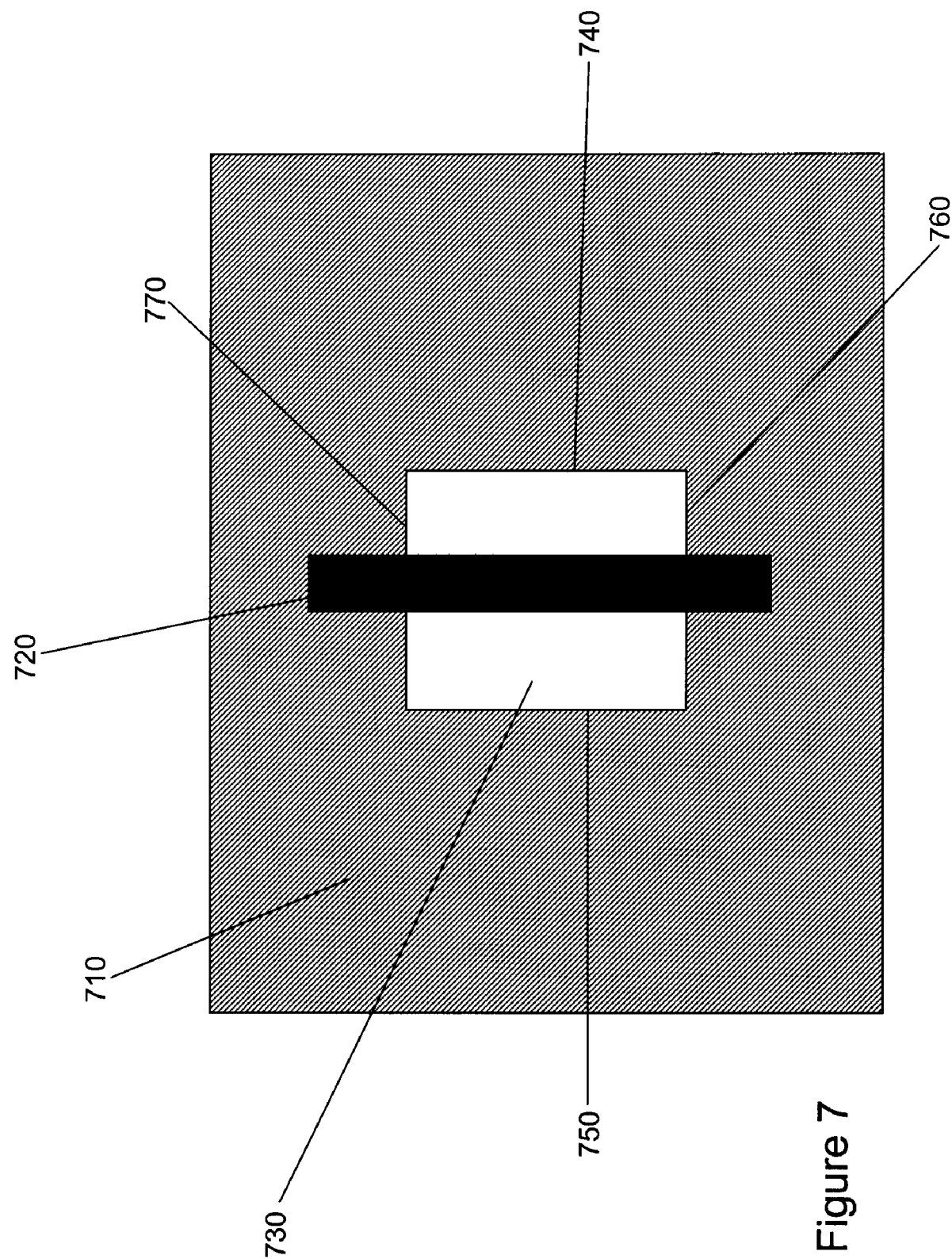
FIG. 7 shows a top plan view of an active device (e.g., an nFET or pFET) surrounded by a shallow trench isolation.

Each active device in a semiconductor may have a shallow trench isolation that surrounds the device. Typically the shallow trench isolation includes four sides. By way of example and not limitation, FIG. 7 provides a top plan view of a shallow trench isolation 710 surrounding an active device comprised of a gate electrode 720 and an active silicon area 730. The shallow trench isolation 710 includes two sides 740 and 750 parallel to the direction of current flow and two sides 760 and 770 transverse to the direction of current flow. Furthermore, the sides may have STI overhangs or may be devoid of overhangs. An overhang on side 740 and/or 750, which are sides parallel to the direction of current flow, is an overhang parallel to the direction of current flow. An overhang on side 760 and/or 770, which are sides transverse to the direction of current flow, is an overhang transverse to the direction of current flow.

Figure 8:
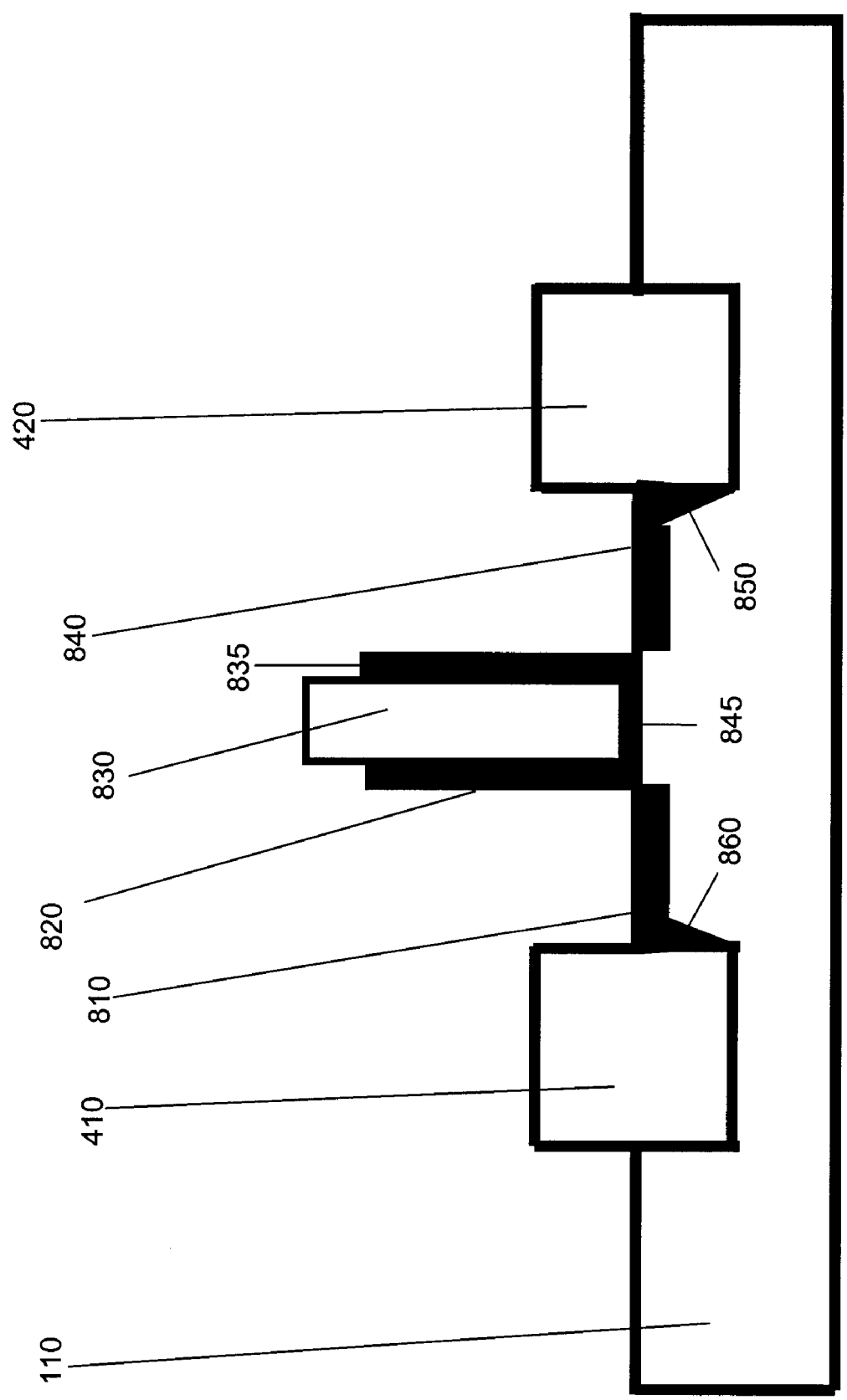
FIG. 8 shows a pFET device in accordance with an exemplary embodiment of the invention.

Referring now to FIG. 8, an exemplary pFET device is shown. The exemplary device includes a shallow trench isolation with sides 410 and 420 without overhangs in the direction parallel to the direction of current flow. STI overhangs may be provided in the transverse direction for pFETs. The active device may be comprised of conventional gate dielectric 845, a gate electrode 830 and side-wall spacers 820 and 835 all formed in a conventional manner. Silicide (e.g., $TiSi_2$, $TaSi_2$ or $MoSi_2$) 810 and 840 for source and drain contacts may also be provided.

Figure 9:
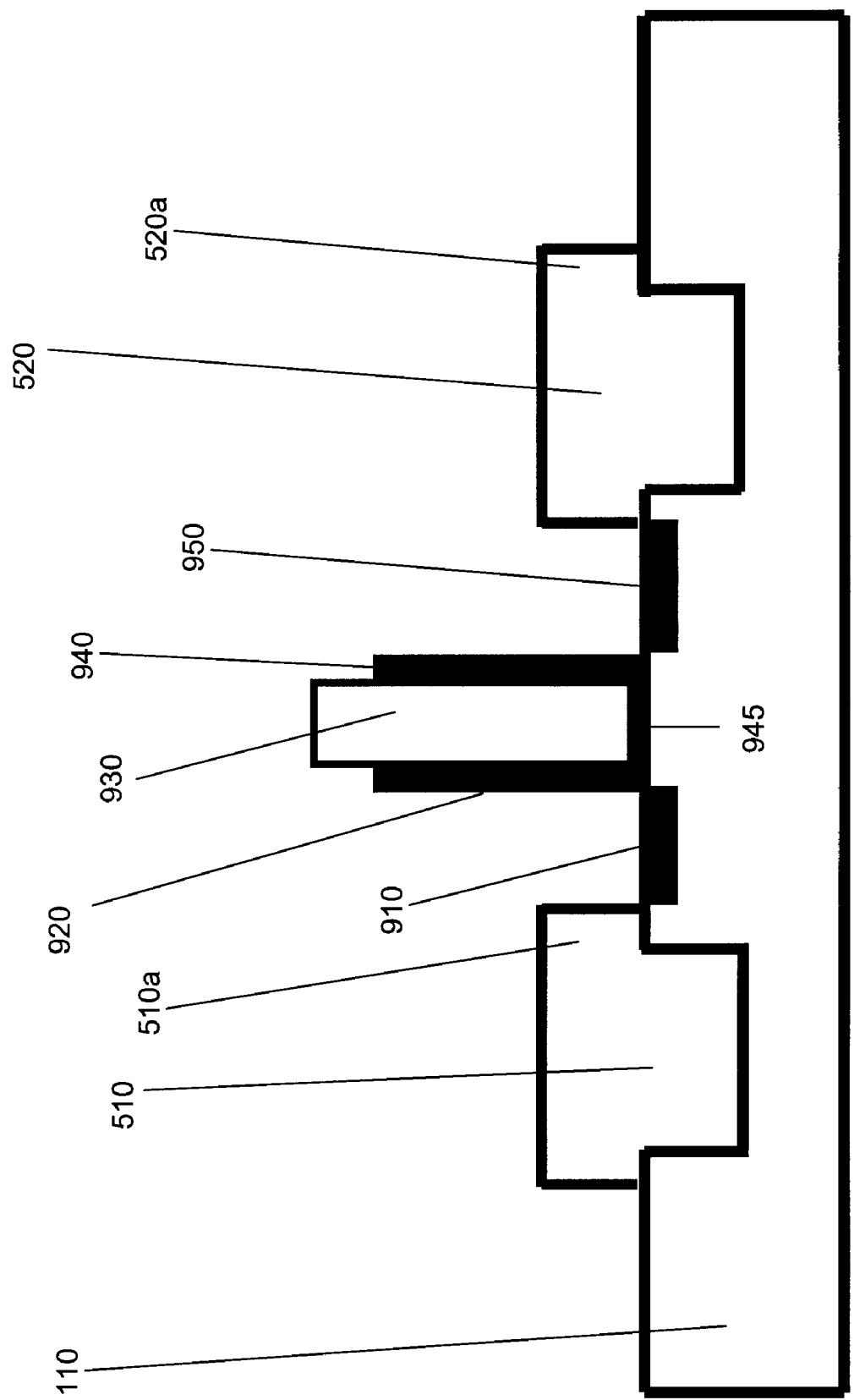
FIG. 9 shows an nFET device in accordance with an exemplary embodiment of the invention.

Referring now to FIG. 9, an exemplary nFET device is shown. The device includes a shallow trench isolation with sides 510 and 520 having overhangs in the direction parallel to the direction of current flow. The active device may be comprised of conventional gate dielectric 945, a gate electrode 930 and sidewall spacers 920 and 940. Silicide (e.g., $TiSi_2$, $TaSi_2$ or $MoSi_2$) 910 and 950 for source and drain contacts may also be provided. The overhangs prevent oxidation induced bird's beak formation near the vertical Si—$SO_2$ interface. Thus, oxidation induced compressive stresses, which would degrade electron mobility of the nFET, are avoided.

Figure 10:
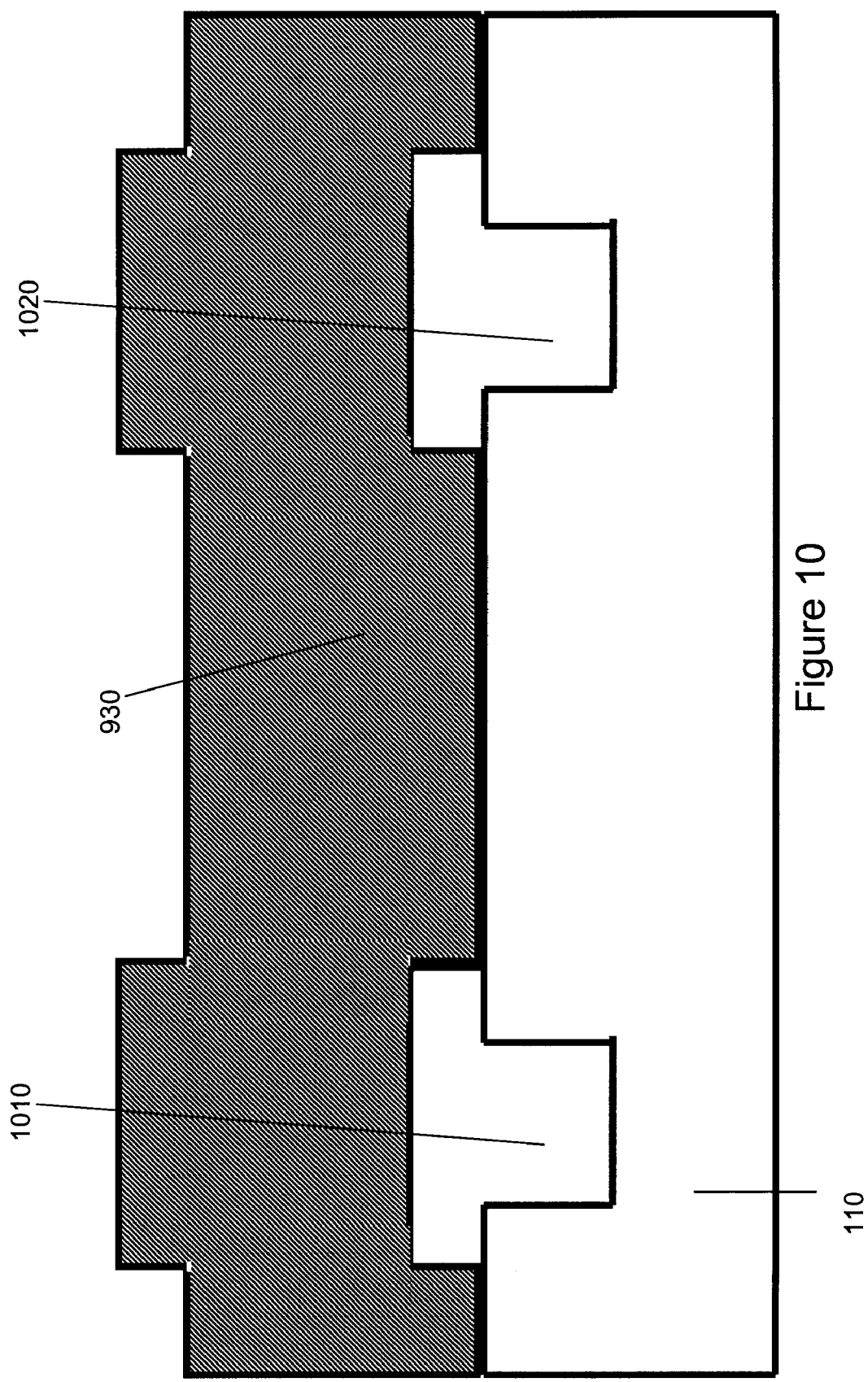
FIG. 10 shows a parallel-to-gate view of an exemplary pFET device having STI overhangs in the direction transverse to current flow.

Referring now to FIG. 10, a cross-sectional parallel-to-gate 930 view of a pFET device in accordance with an exemplary embodiment of the invention shows STI overhangs 1010 and 1020 in the direction transverse to current flow. The STI overhangs 1010 and 1020 prevent oxidation induced compressive stress formations (e.g., bird's beak formations) in the transverse direction, thus preventing a degradation of hole mobility. The STI overhangs in the transverse direction may be formed using a technique (e.g., a silicon nitride pullback process), as used to form STI overhangs in the direction parallel to the direction of current flow.

Figure 11:
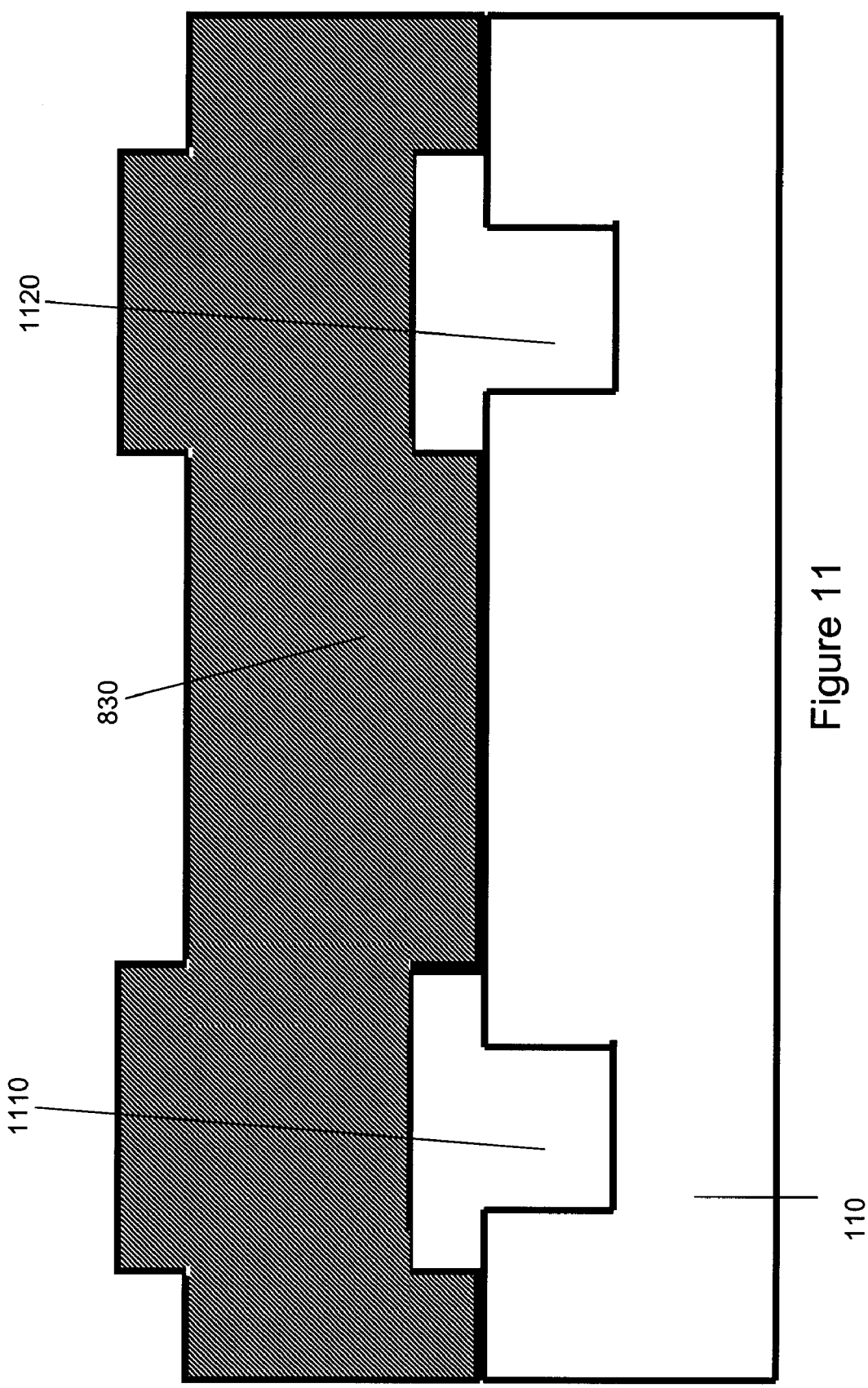
FIG. 11 shows a parallel-to-gate view of an nFET device having STI overhangs in the direction transverse to current flow.

Similarly, FIG. 11 provides a cross-sectional parallel-to-gate 830 view of an exemplary nFET device which shows STI overhangs 1110 and 1120 in the direction transverse to current flow. The STI overhangs 1110 and 1120 prevent oxidation induced compressive stress formations in the transverse direction, thus preventing a degradation of electron mobility. Again, the STI overhangs in the transverse direction may be formed using a technique (e.g., a silicon nitride pullback process) as used to form STI overhangs in the direction parallel to the direction of current flow.

Stress effects are inversely related to distance from the active device. The closer the source of oxidation induced compressive stresses is to an active device, the greater the impact on performance. Conversely, the greater the distance between a field effect transistor gate and a source of oxidation induced compressive stress (e.g., a bird's beak formation), the less appreciable the influence on performance. Furthermore, sources of oxidation induced compressive stress (e.g., bird's beak formations) that are more than a determined distance from a determined active structure (e.g., the nearest edge of a transistor gate) may not appreciably affect performance (e.g., electron or hole mobility) for that structure. Consequently, in one embodiment of the invention, STI overhangs may be implemented if the distance between the STI and the determined structure is less than or equal to the determined distance. The determined distance may vary depending upon factors that may influence the magnitude of stress induced. Such factors may include, by way of example, thermal mismatch between the isolation, dielectric and silicon substrate; intrinsic stress of a nitride mask; as well as fabrication steps and conditions. Because a stress source beyond that distance may not have an appreciable effect on performance, in such a case formation of STI overhangs may not be warranted for stress reduction purposes. By way of example and not limitation, a distance of 5.0μ (microns) or greater from a nearest edge of an nFET or pFET gate may be sufficient to avoid performance degradation.

STI overhang structures in accordance with an exemplary implementation may therefore be selectively configured to prevent bird's beak formations where compressive stresses caused by such formations would degrade performance. Considerations such as the type of device (e.g., nFET or pFET), the distance from the active device and the direction of current flow may influence whether an overhang should be formed and the arrangement of the overhang. While STI overhangs may be provided in both the directions parallel and transverse to the direction of current flow for nFETs; a pFET may have an STI overhang in the transverse direction, but should not have an overhand, in embodiments, in the parallel direction. The selective configuration may further take into account the distance between an STI and the active device (e.g., the distance between an STI and a nearby gate). If the distance prevents bird's beak formations adjacent to the STI from having any appreciable effects on performance, then overhangs may be omitted.

While the invention has been described in terms of exemplary embodiments, those skilled in the art will recognize that the invention can be practiced with modifications and in the spirit and scope of the appended claims.

The invention claimed is:

1. A semiconductor structure formed on a substrate, comprising:
    an n-channel field effect transistor having a source, a drain, a gate, and a direction of current flow from the source to the drain;
    a first shallow trench isolation for the n-channel field effect transistor comprising a first shallow trench isolation side, the first shallow trench isolation side having at least one overhang configured to prevent oxidation induced stress in a direction parallel to the direction of current flow for the n-channel field effect transistor,
    the first shallow trench isolation for the n-channel field effect transistor further comprising a second shallow trench isolation side being transverse to the first shallow trench isolation side and having at least one overhang configured to prevent oxidation induced stress in a direction transverse to the direction of current flow for the n-channel field effect transistor;
    a p-channel field effect transistor, the p-channel field effect transistor having a source, a drain, a gate, and a direction of current flow from the source to the drain;
    a second shallow trench isolation for the p-channel field effect transistor having a third shallow trench isolation side, the third shallow trench isolation side being devoid of an overhang; and
    the second shallow trench isolation for the p-channel field effect transistor further having a fourth shallow trench isolation side, the fourth shallow trench isolation side being transverse to the third shallow trench isolation side and having at least one overhang configured to prevent oxidation induced stress in a direction transverse to the direction of current flow for the p-channel field effect transistor.

2. The semiconductor structure of claim 1, wherein the overhang configured to prevent oxidation induced stress in a direction transverse to the direction of current flow prevents a degradation of hole mobility.

3. The semiconductor structure of claim 1, wherein:
the distance from the gate of the n-channel field effect transistor to the first shallow trench isolation side of the first shallow trench isolation for the n-channel field effect transistor is less than or equal to a distance within which oxidation induced stress adjacent to the first shallow trench isolation would affect performance of the n-channel field effect transistor, and
the distance from the gate of the n-channel field effect transistor to the second shallow trench isolation side of the first shallow trench isolation for the n-channel field effect transistor is less than or equal to a distance within which oxidation induced stress adjacent to the second shallow trench isolation would affect performance of the n-channel field effect transistor.

4. The semiconductor structure of claim 1, wherein the distance from the gate of the p-channel field effect transistor to the fourth shallow trench isolation side for the second shallow trench isolation for the p-channel field effect transistor is less than or equal to a distance within which oxidation induced stress adjacent to the fourth shallow trench isolation side would affect performance of the p-channel field effect transistor.

5. The semiconductor structure of claim 4, wherein the distance from the gate of the p-channel field effect transistor to the fourth shallow trench isolation side is less than or equal to about 5.0 microns.

6. The semiconductor structure of claim 3, wherein the distance from the gate of the n-channel field effect transistor to the first shallow trench isolation side is less than or equal to about 5.0 microns.

7. The semiconductor structure of claim 3, wherein the distance from the gate of the n-channel field effect transistor to the second shallow trench isolation side is less than or equal to about 5.0 microns.

8. A semiconductor structure, comprising:
an first transistor having a first shallow trench isolation having:
a side with at least one overhang configured to prevent oxidation induced stress in a direction parallel to a direction of current flow; and
a transverse side having at least one overhang configured to prevent oxidation induced stress in a direction transverse to the direction of current flow for the first transistor;
a second transistor with a shallow trench isolation having:
a side devoid of an overhang; and
a traverse side having at least one overhang configured to prevent oxidation induced stress in a direction transverse to the direction of current flow for the second transistor, wherein
the at least one overhang of the first transistor and the second transistor are provided when a distance between an STI and one of the first transistor and the second transistor is less than or equal to a predetermined distance which varies based on at least one of thermal mismatch between isolation, dielectric and silicon substrate and intrinsic stress of a nitride mask used to form the semiconductor structure.

9. The semiconductor structure of claim 8, wherein the first transistor is an n-channel field effect transistor and the second transistor is a p-channel field effect transistor.

10. The semiconductor structure of claim 9, wherein the n-channel field effect transistor and the p-channel field effect transistor have a source, a drain, a gate, and the direction of current flow is from the source to the drain.

11. The semiconductor structure of claim 8, wherein the overhang of the first and second transistor configured to prevent oxidation induced stress in a direction transverse to the direction of current flow prevents a degradation of hole mobility.

12. The semiconductor structure of claim 8, wherein the predetermined distance is a distance from a gate of the first transistor to the side of the shallow trench isolation for the first transistor which is less than or equal to a distance within which oxidation induced stress adjacent to the shallow trench isolation would affect performance of the n-channel field effect transistor.

13. The semiconductor structure of claim 8, wherein the predetermined distance is a distance from a gate of the first transistor to the transverse side of the shallow trench isolation for the first transistor which is less than or equal to a distance within which oxidation induced stress adjacent to the shallow trench isolation would affect performance of the n-channel field effect transistor.

14. The semiconductor structure of claim 13, wherein the distance from the gate of the first transistor to the side of the shallow trench isolation of the first transistor is less than or equal to about 5.0 microns.

15. The semiconductor structure of claim 8, wherein the predetermined distance is a distance from a gate of the second transistor to the transverse side for the shallow trench isolation for the second transistor which is less than or equal to a distance within which oxidation induced stress adjacent to the transverse side would affect performance of the p-channel field effect transistor.

16. The semiconductor structure of claim 15, wherein the distance from the gate of the second transistor to the transverse side is less than or equal to about 5.0 microns.

* * * * *